(12) United States Patent
Honda

(10) Patent No.: US 6,752,701 B1
(45) Date of Patent: Jun. 22, 2004

(54) PLANARIZATION APPARATUS WITH GRINDING AND ETCHING DEVICES AND HOLDING DEVICE FOR MOVING WORKPIECE BETWEEN SAID DEVICES

(75) Inventor: Katsuo Honda, Mitaka (JP)

(73) Assignee: Tokyo Seimitsu Co., Ltd., Tokyo (JP)

( * ) Notice: Subject to any disclaimer, the term of this patent is extended or adjusted under 35 U.S.C. 154(b) by 416 days.

(21) Appl. No.: 09/718,387

(22) Filed: Nov. 24, 2000

(30) Foreign Application Priority Data

Nov. 30, 1999 (JP) ............................................. 11-339356

(51) Int. Cl.⁷ .............................. B24B 7/00; B24B 9/00
(52) U.S. Cl. .............................. 451/67; 451/41; 451/54
(58) Field of Search ............................ 451/54, 65, 67, 451/41; 438/690, 691, 692; 216/88, 89, 90

(56) References Cited

U.S. PATENT DOCUMENTS

| 5,185,965 | A | * | 2/1993 | Ozaki ............................ 451/5 |
| 5,268,065 | A | | 12/1993 | Grupen-Shemansky |
| 6,252,239 | B1 | * | 6/2001 | Goruganthu et al. ... 250/559.27 |
| 6,403,447 | B1 | * | 6/2002 | Parab .......................... 438/459 |
| 6,491,836 | B1 | * | 12/2002 | Kato et al. .................... 216/88 |

FOREIGN PATENT DOCUMENTS

JP        363256342 A  * 10/1988

* cited by examiner

Primary Examiner—Timothy V. Eley
(74) Attorney, Agent, or Firm—Nixon Peabody LLP; David S. Safran

(57) ABSTRACT

In the planarization apparatus, an etching stage is installed in a body where a rough grinding stage and a finishing grinding stage are disposed, and the rough grinding, finishing grinding, and etching of a wafer are performed in the same planarization apparatus. A chuck for holding the wafer is moved in an order through the rough grinding stage, the finishing grinding stage and the etching stage while keeping holding the wafer. When the chuck is positioned at the etching stage, the chuck is moved up toward an etching vessel and the wafer that is held by the chuck is housed in the etching vessel. In this state, etching solution is projected on the wafer from a nozzle and the wafer is etched.

3 Claims, 8 Drawing Sheets

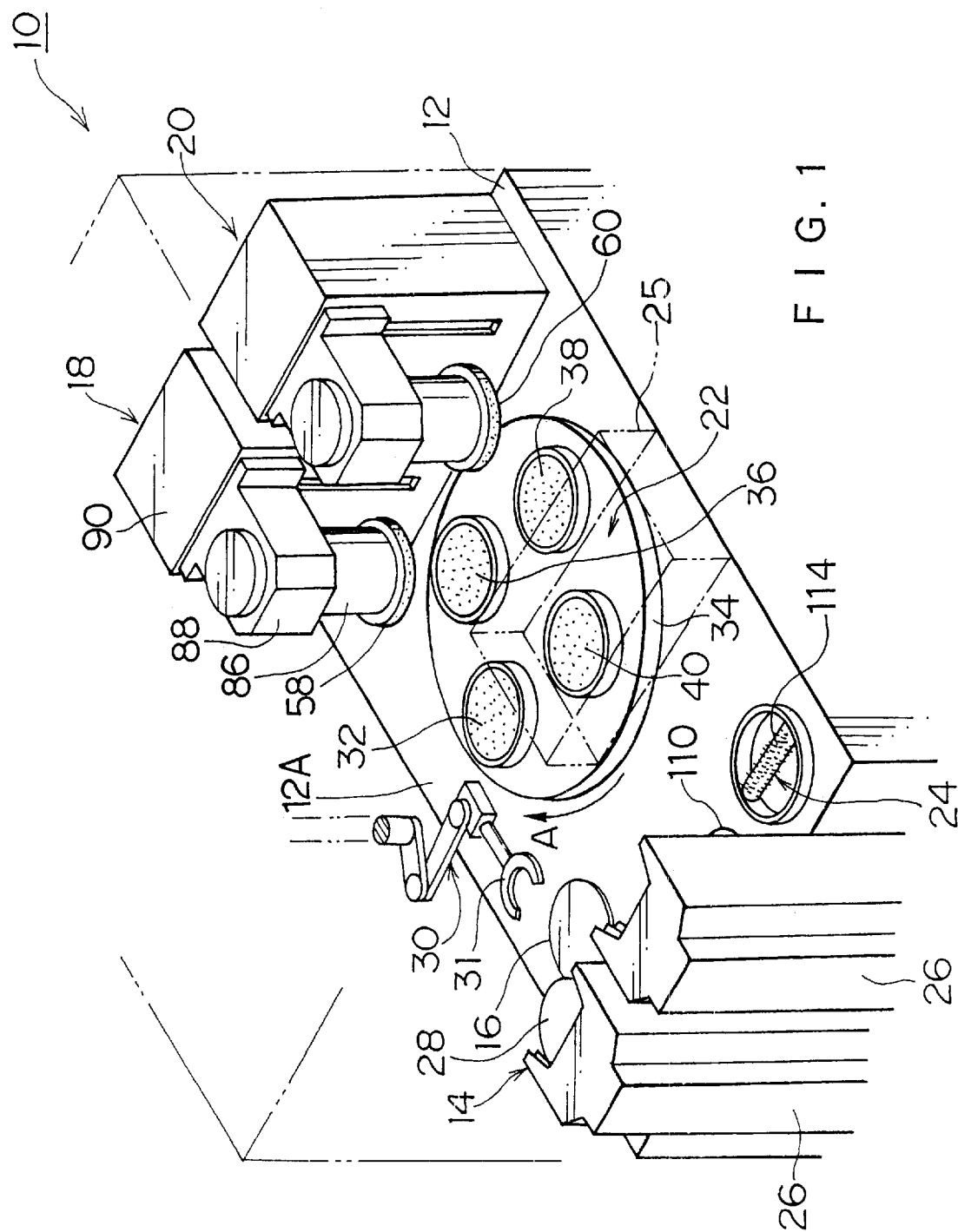
F I G. 1

| | RATE($\mu$m/min) | PROCESS AMOUNT($\mu$m) | TIME(min) |
|---|---|---|---|
| ROUGH GRINDING | 225 | 510 | 2.27 |
| FINISHING GRINDING | 65 | 150 | 2.31 |
| ETICHING | 6 | 14.9 | 2.48 |

PLANARIZATION APPARATUS WITH GRINDING AND ETCHING DEVICES AND HOLDING DEVICE FOR MOVING WORKPIECE BETWEEN SAID DEVICES

BACKGROUND OF THE INVENTION

1. Field of the Invention

The present invention relates generally to a planarization apparatus, particularly to a planarization apparatus of a type that processes the reverse of a semiconductor wafer.

2. Description of Related Art

A planarization apparatus that grinds one face or the reverse, on which chips are not formed, of a semiconductor wafer includes a chuck for holding the wafer, a grinding wheel for rough grinding, a grinding wheel for a finishing grinding, a reverse face cleaning unit, and so forth. In the planarization apparatus, the other face or the obverse of the wafer is held by the chuck by suction, and the rough grinding wheel is pressed against the reverse, then the reverse is roughly ground by rotating the chuck and the grinding wheel. After that, the wafer that has been roughly ground is detached from the chuck. Then, the wafer is held by another chuck for the finishing grinding and is finely ground by the finishing grinding wheel. The wafer of which reverse has been finely ground is then transported to the reverse cleaning unit, and the reverse is cleaned. Thus, the grinding process for the reverse of one wafer by the planarization apparatus is completed.

The wafer for which the reverse face grinding has been completed is transferred to the next process, an etching process. The wafer is transported from the planarization apparatus to the etching unit, and is etched, so as to remove a broken layer (also called a spoiled layer or a damaged layer) which was formed on the reverse of the wafer during the reverse face grinding.

However, if the wafer is ground in the planarization apparatus to be extremely thin that is close to a finished product, the wafer is easily broken (cracked) when transporting the wafer from the planarization apparatus to the etching unit because the wafer is extremely thin and hence weak in view of strength, and also because of the broken layer formed on the reverse of the wafer.

In order to avoid this problem, the conventional planarization apparatus grinds the wafer in a thickness with which the wafer is not broken during the transportation. Describing the thickness of the wafer for example, a wafer is sliced in thickness of 725 $\mu$m from an ingot. The wafer is then ground by the planarization apparatus in the thickness of 250 $\mu$m in the rough grinding, and is further ground in the thickness of 200 $\mu$m in the finishing grinding. Thereafter, the wafer is processed in the standardized thickness of 50 $\mu$m by the last process, the etching process.

As described above, in order to prevent the breakage of the wafer during the transportation, the wafer cannot be processed close to the standardized thickness in the conventional planarization apparatus. Because of that, the removal amount in the etching process (150 $\mu$m in the above example) must be large and the time for etching has to be long, thus the throughput cannot be improved.

SUMMARY OF THE INVENTION

The present invention has been developed in view of the above-described circumstances, and has as its object the provision of a planarization apparatus by which the throughput can be improved without breaking the workpiece.

In order to achieve the above-described objects, the present invention is directed to a planarization apparatus, comprising: a holding device which holds a workpiece; a grinding device comprising a grinding wheel which grinds a face of the workpiece held by the holding device; and an etching device which etches the workpiece.

As the holding device, the following devices can be used such as: a device which holds the workpiece by suction, a device which freezes and holds the workpiece through an ice film, a device which holds the workpiece with static electricity, a device which holds the workpiece with an adhesive sheet, a device which holds the workpiece with a friction force, and a device on which the workpiece is simply placed.

According to the present invention, since the etching device is installed in the planarization apparatus including the grinding device, the grinding and etching of the wafer can be performed in the same apparatus. Thus in the present invention, the workpiece does not have to be transported from the planarization apparatus to a separate etching apparatus, so that the workpiece can be ground by the grinding device in the thickness close to the standardized thickness. The throughput can be therefore improved.

Preferably, the planarization apparatus further comprises a moving device which moves the holding device between a grinding position of the grinding device and an etching position of the etching device, and the workpiece is ground by the grinding device and etched by the etching device while keeping held by the holding device.

According to the present invention, the planarization apparatus can precisely process the workpiece without breaking the workpiece because the workpiece is ground and etched while keeping held by the holding device. In contrast, the conventional apparatus transfers the workpiece from a holding device that is exclusively used for the grinding device to another holding device that is exclusively used for the etching, and the problem hence occurs in that the workpiece may be broken by an external force when transferring the workpiece. The present invention can eliminate this problem.

Preferably, the etching device etches a broken layer formed on the face of the workpiece having been ground by the grinding device, and/or the etching device etches the face of the workpiece by an amount of thickness variation of the workpiece. Thereby, a precisely-processed workpiece can be obtained.

Moreover, a plurality of holding devices are provided, and the holding devices are moved from the grinding position to the etching position in an order. Thus, the grinding and etching can be performed at the same time, and the net working rate is improved compared with the case in which the workpiece is ground and etched with one holding device.

The holding device is detachably connected with a spindle, and the holding device can independently be moved by detaching the holding device from the spindle whenever the moving device moves the holding device. Therefore, the workload on the moving device can be reduced, and only the spindles that are suitable for the respective processes are necessary. Hence, the manufacturing cost of the apparatus can be low.

Further, the etching device is installed in the planarization apparatus including a rough grinding device and a finishing grinding device. Hence, the successive process from the rough grinding, the finishing grinding through the etching can be performed by only one planarization apparatus. In addition, the moving device is provided for moving the holding device for the workpiece to the rough grinding position, the finishing grinding position, and the etching position; thus, the entire process can efficiently work without dropping the net working rate even though the construction is such that the single or plural rough grinding device, the single or plural finishing grinding device, and the single or plural etching device are arranged in combinations.

In the planarization apparatus according to the present invention, the holding device is transferred toward the etching vessel by the transferring device so that the workpiece is housed in the etching vessel while the holding device keeps holding the workpiece. Then, the etching solution is projected from a nozzle to the workpiece to etch the workpiece. Therefore, the workpiece can be precisely processed without breakage.

The planarization method according to the present invention is applied to the planarization apparatus comprising the grinding device and the etching device. The etching device etches the workpiece by an amount more than a removal amount required for removing the broken layer formed by the finishing grinding, calculated by doubling a standard deviation, and less than a larger value between a removal amount required for correcting an unevenness of a thickness during the finishing grinding and removing the broken layer, calculated by sextupling a standard deviation, and 20 $\mu$m. This enables the removal of the broken layer formed by the finishing grinding without lowering the rate of operation.

Further, the planarization method according to the present invention is applied to the planarization apparatus comprising a rough grinding device, a finishing grinding device and the etching device. The finishing grinding device finely grinds the workpiece by an amount more than an amount required for removing the broken layer formed by the rough grinding, calculated by doubling a standard deviation, and less than a larger value between a removal amount required for correcting an unevenness of a thickness during the rough grinding and removing the broken layer, calculated by sextupling a standard deviation, and 150 $\mu$m. This enables the removal of the broken layer formed by the rough grinding without lowering the rate of operation.

Furthermore, the planarization apparatus according to the present invention comprises a sensor which measures the thickness of the workpiece, and the thickness of the workpiece is measured before and/or during the process so that the grinding amount and/or the etching amount can be controlled in accordance with the measured value; thus the wafer can be processed with a desired thickness.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein:

FIG. 1 is a perspective view showing a planarization apparatus for a semiconductor wafer according to an embodiment of the present invention;

DETAILED DESCRIPTION OF THE PREFERRED EMBODIMENTS

Figure 2:
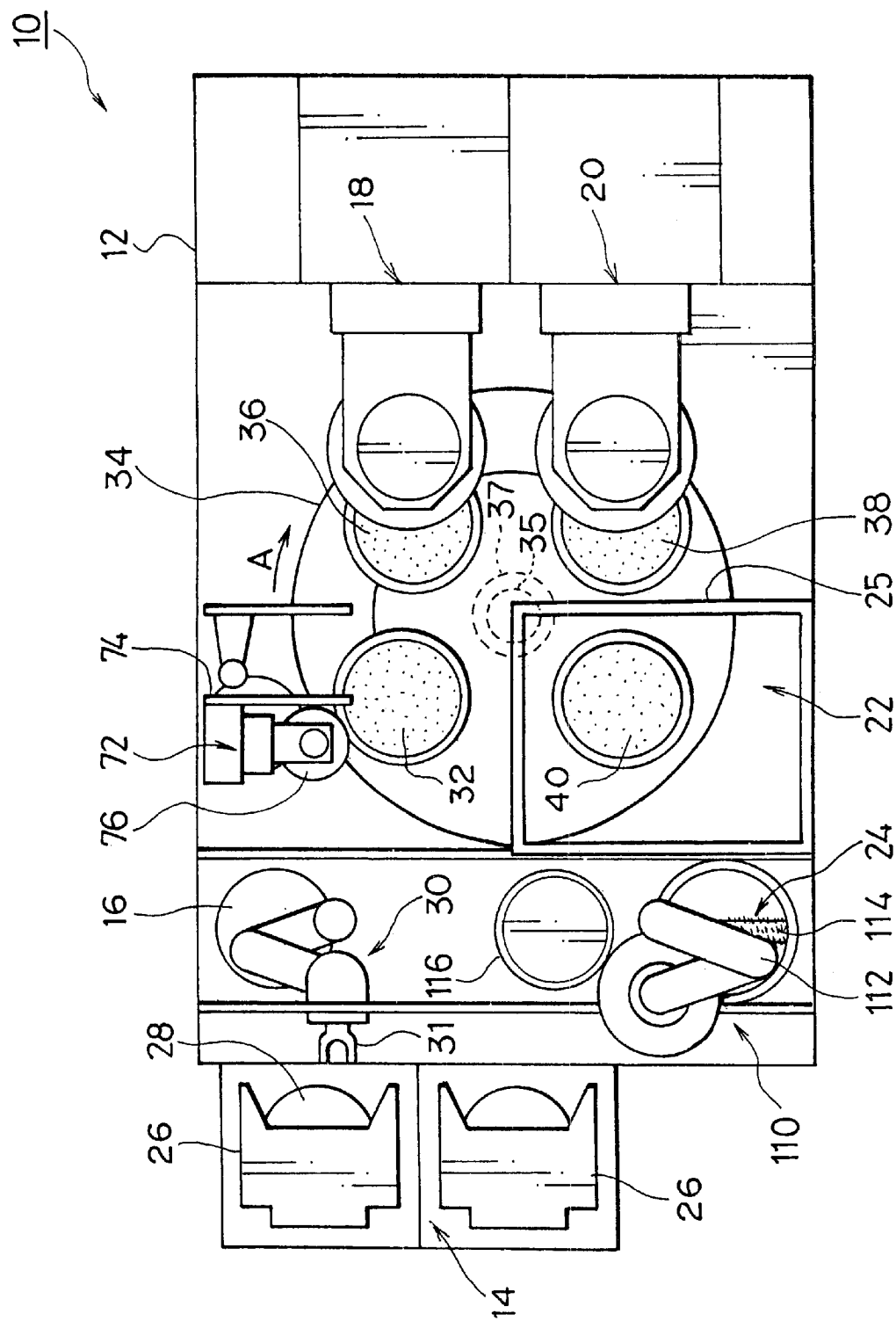
FIG. 2 is a plan view of the planarization apparatus in FIG. 1.

Hereunder preferred embodiments of a planarization apparatus according to the present invention will be described in detail in accordance with the accompanied drawings. FIG. 1 is a perspective view of a planarization apparatus 10 for a semiconductor wafer to which the present invention is applied, and FIG. 2 is a plan view of the planarization apparatus 10.

As shown in FIG. 1, a body 12 of a planarization apparatus 10 is provided with a cassette housing stage 14, an alignment stage 16, a rough grinding stage 18, a finishing grinding stage 20, an etching stage 22, a wafer cleaning stage 24, and so forth. The etching stage 22 includes a box-like etching vessel 25 by which the etching stage 22 is divided from the rough grinding stage 18 and the finishing grinding stage 20, so that the chemical etching solution that is used at the etching stage 22 is prevented from splashing onto the rough grinding stage 18 and the finishing grinding stage 20. As a general chemical for etching the surface of the silicon wafer, a mixed acid of hydrofluoric acid (HF) and nitric acid ($HNO_3$) is used, and acetic acid ($CH_3COOH$) and water ($H_2O$) may be mixed for moderation.

In the cassette housing stage 14, two cassettes 26 are detachably set, and number of unprocessed wafers 28 are housed in a plurality of shelves of the cassettes 26. Each of the wafers 28 is held by a hand 31 of a transporting device or a robot 30 and is transported in an order the alignment stage 16 of the next process. The transporting robot 30 may be supported by suspending it via an elevator at a beam (not shown) which is erected at the body 12, or may be disposed on a top face 12A of the body 12. If the transporting robot 30 is suspended, a space between the cassette housing stage 14 and the alignment stage 16 can be narrowed, and thus the planarization apparatus 10 can be compact in size. The robot 30 is a common six-jointed robot and its structure is well-known, and the description on it is omitted.

The alignment stage 16 is a stage for aligning the wafer 28 that is transported from the cassette 26 at a predetermined position. The wafer 28 that has been aligned at the alignment stage 16 is held by suction again by the hand 31 of the transporting robot 30 and is transported to a holding device or a chuck 32 that is empty, then is held by suction at a suction face of the chuck 32.

The chuck 32 is disposed at an index table 34, and chucks 36, 38 and 40 with the same function as the chuck 32 are disposed at every 90 degree on the circumference of the index table 34 with a rotation axis 35 shown by a broken line in FIG. 2 as the center. The rotation axis 35 is connected with a moving device or a spindle (not shown) of a motor 37 shown by a broken line in FIG. 2. The chuck 36 is positioned at the rough grinding stage 18 where the held wafer 28 is roughly ground. The chuck 38 is positioned at the finishing grinding stage 20 where the held wafer 28 is finely ground (processed under finishing grinding and spark-out). The chuck 40 is positioned at the etching stage 22 where the held wafer 28 is etched, so that the broken layer and the thickness variation of the wafer 28 that are generated in the grindings are removed.

Figure 3:
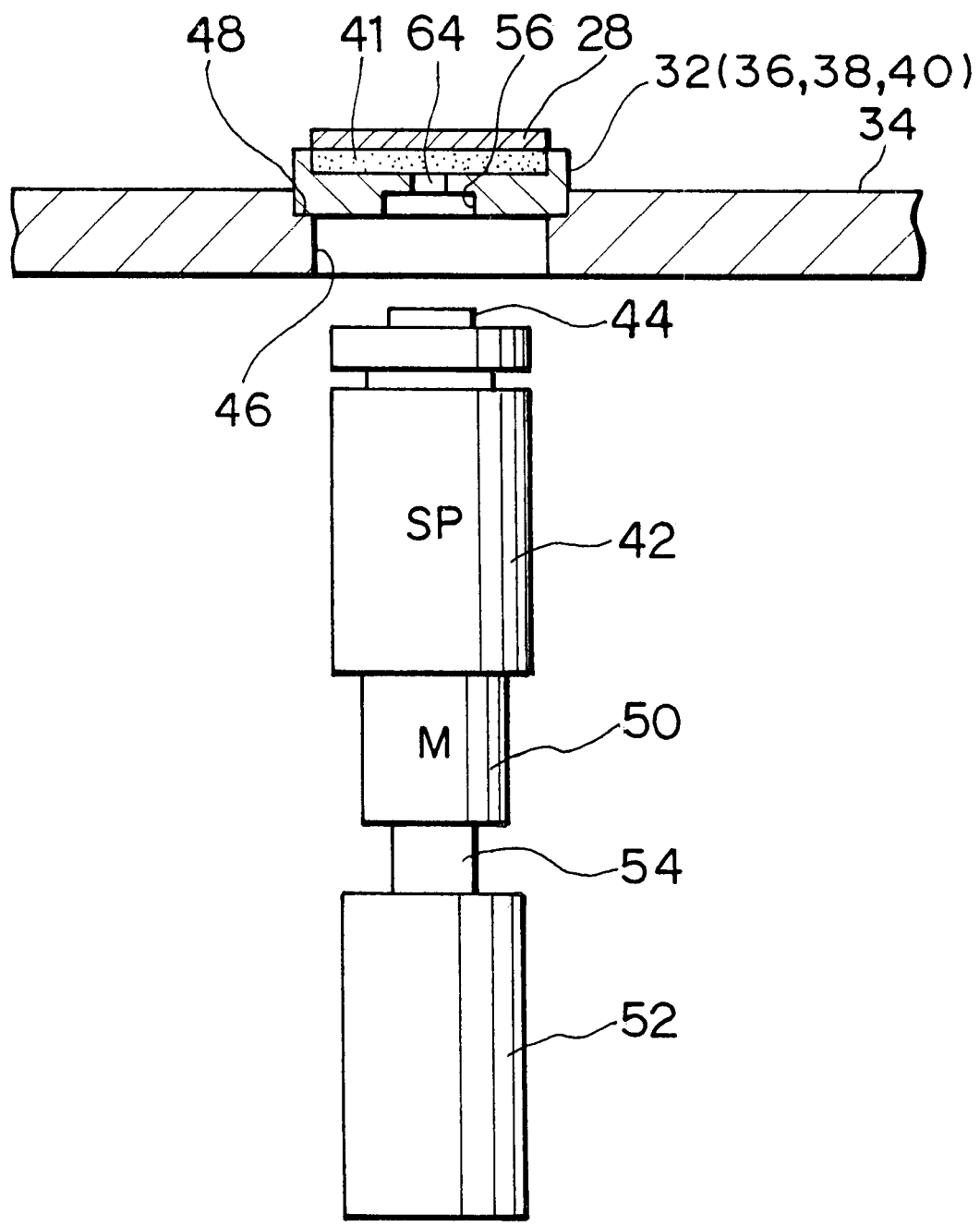
FIG. 3 is an explanatory view in which a chuck and a spindle are separated by a connecting member.
Figure 4:
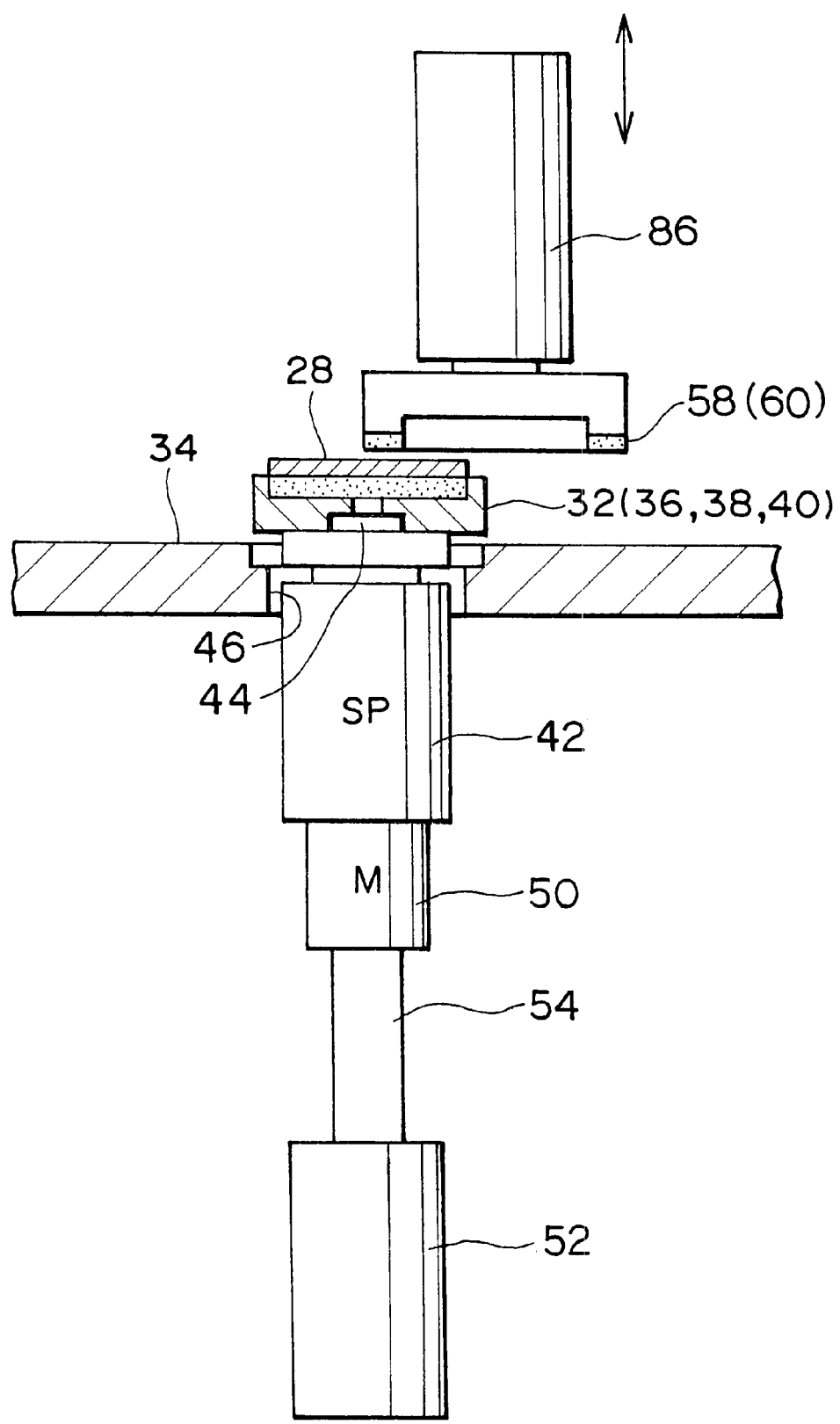
FIG. 4 is an explanatory view in which the chuck and the spindle are connected by the connecting member.

As shown in FIGS. 3 and 4, each of the chucks 32, 36, 38 and 40 is detachably connected with a spindle 42 via a connecting member 44. The connecting member 44 is detached from the chucks 32, 36, 38 and 40 every time the chucks 32, 36, 38 and 40 are moved by the motor 37 (shown in FIG. 2). Since the chucks 32, 36, 38 and 40 only are thereby moved by the motor 37, the workload on the motor 37 can be decreased, and the spindles and the motors can be appropriately provided for the rough grinding, finishing grinding, and etching, respectively, and that the manufacturing cost of the apparatus can be lowered.

In FIG. 3, the chuck 32 (36, 38 or 40) is placed on a step 48 of an opening 46 formed at the index table 34. A piston 54 of a cylinder device 52 is connected with the bottom of a motor 50. When the piston 54 is extended as shown in FIG. 4, the connecting member 44 goes through the opening 46 and fits into a recess 56 formed at the bottom of the chuck 32 (36, 38 or 40) so as to connect with the chuck 32 (36, 38 or 40). Then, the chuck 32 (36, 38 or 40) is moved up from the index table 34 by continuing extending movement of the piston 54, and is positioned at the grinding position under the grinding wheel 58 (or 60).

The chucks 32, 36, 38 and 40 in this embodiment have the holding faces that are made of porous body 41 of sintered material such as ceramics. When the connecting member 44 is connected with the recess 56, a fluid joint (not shown) is connected at the same time, and the suction force of a suction pump (not shown) that is connected with the fluid joint affects the porous body 41 via an air passage 64, whereby the wafer 28 is securely held by suction on the surface of the porous body 41. When the connecting member 44 is detached, the suction force is retained by a check valve (not shown).

Figure 5:
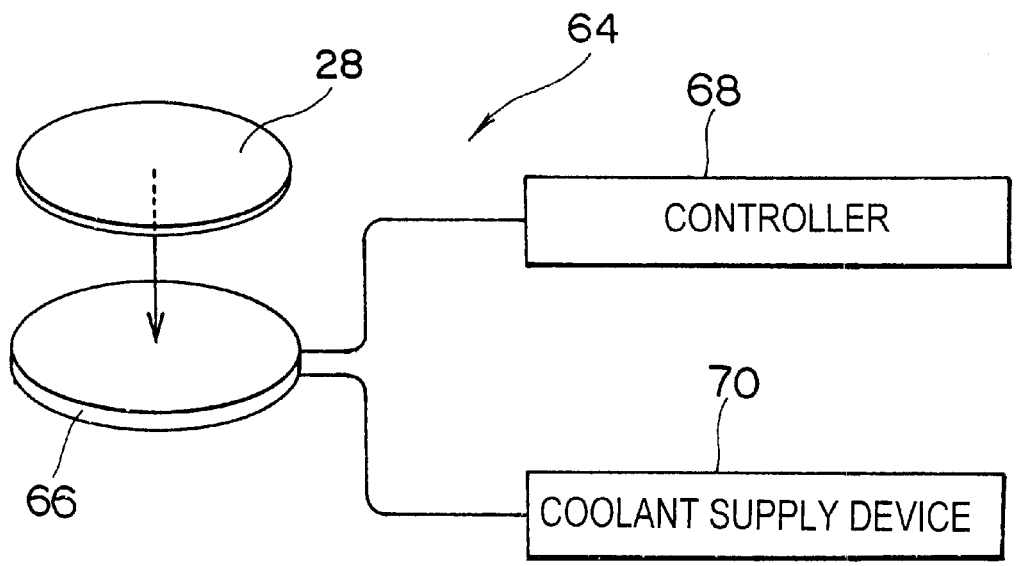
FIG. 5 is a constructional view of a freezing chuck unit.

In this embodiment, only the chucks 32, 36, 38 and 40 for holding the wafer 28 by suction are described; however, the types of chucks are not limited only to that. A freezing chuck unit 64 in FIG. 5 may be applied instead.

The freezing chuck unit 64 comprises a chuck plate 66, a controller 68, and a coolant supply unit 70. The freezing chuck unit 64 applies voltage to the chuck plate 66 by the controller 68, and by use of the Peltier effect caused by the application of the voltage freezes and holds the wafer 28 to the chuck plate 66 through an ice film. The chuck plate 66 forms a closed-circuit (a thermocouple) by joining two plates made of dissimilar metals, for example, copper (Cu) and bismuth (Bi). The chuck plate 66 freezes and holds the wafer 28 at the Cu plate side by maintaining an electric current in the thermocouple. The coolant supply unit 70 supplies the coolant to the Bi plate side of the thermocouple so as to remove heat generated at the Bi plate side.

Instead of the freezing chuck unit 64, a static electricity chuck unit, which holds the wafer by the action of static electricity, a holding device that holds the wafer through an adhesive sheet or a friction plate, or even a placing means for merely placing the wafer may be applied.

The holding face of the chuck 32 that is positioned at the chucking position of the wafer 28 in FIG. 2 is cleaned by a cleaner 72 before the wafer 28 is transported to the chuck 32. The cleaner 72 is slidably provided on a rail 74 so as to move along the rail 74 and is positioned on the chuck 32 before cleaning the holding face. The cleaner 72 has a removing member 76, which becomes contact with the holding face of the chuck 32 so as to remove objects such as sludge that has adhered to the holding face. If the holding face of the chuck 32 is made of the porous body of sintered material such as ceramics, the removing member 76 is made of the same material.

Figure 6:
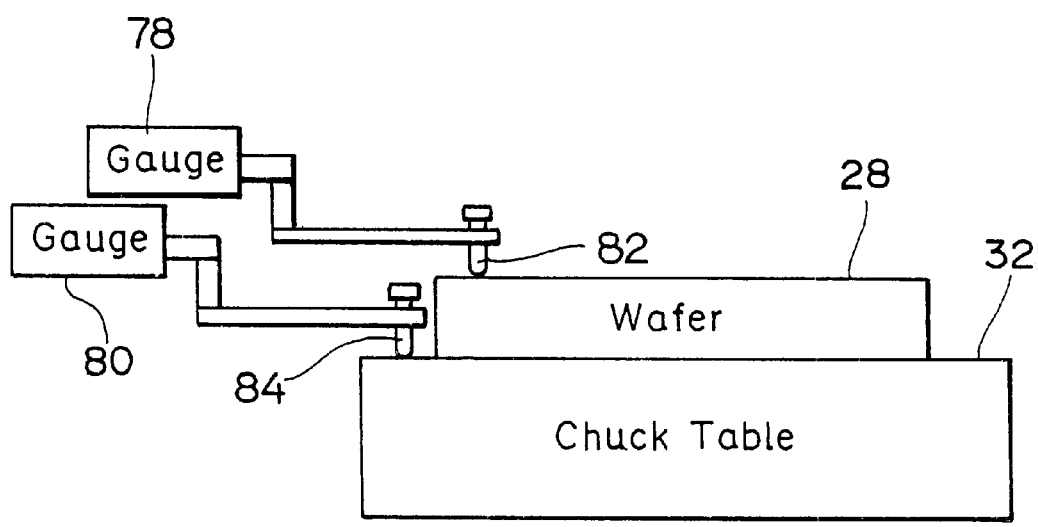
FIG. 6 is a side view of wafer thickness gauges.

The thickness of the wafer 28 held by the chuck 32 is measured by a pair of thickness gauges 78 and 80 in FIG. 6. The thickness gauges 78 and 80 respectively have contact elements 82 and 84, the contact element 82 contacting with the top face (reverse) of the wafer 28, and the contact element 84 contacting with the top face of the chuck 32. The thickness gauges 78 and 80 can measure the thickness of the wafer 28 as a difference in values read by an in-process gauge, with the top face of the chuck 32 as a reference point.

The wafer 28 with its thickness already measured is aligned on the rough grinding stage 18 by a turn by 90 degree in the direction of the arrow A of the index table 34 in FIGS. 1 and 2, and the reverse of the wafer 28 is roughly ground with the cup-shaped grinding wheel 58 of the rough grinding stage 18. As shown in FIG. 1, the cup-shaped grinding wheel 58 is connected with an output shaft (not shown) of a motor 86, and is also attached to a grinding wheel moving unit 90 via a casing 88 for supporting the motor 86. The grinding wheel moving unit 90 moves the cup-shaped grinding wheel 58 up and down along with the motor 86, and the cup-shaped grinding wheel 58 is pressed on the reverse of the wafer 28 by the descending movement of the grinding wheel moving unit 90. The reverse of the wafer 28 is thus roughly ground. The descending distance of the cup-shaped grinding wheel 58, that is, the grinding amount of the cup-shaped grinding wheel 58, is settled in accordance with a predetermined reference position of the cup-shaped grinding wheel 58 and the thickness of the wafer 28 that is measured by the thickness gauges 78 and 80 (shown in FIG. 6).

After the cup-shaped grinding wheel 58 has retreated from the wafer 28, the wafer 28 with its reverse already ground roughly at the rough grinding stage 18 is then measured its thickness by a thickness gauge, which has the same structure as the one in FIG. 6. The wafer 28 with its thickness already measured is placed at the finishing grinding stage 20 by a turn by 90 degree in the direction of the arrow A of the index table 34, and is finely ground and sparked-out by the cup-shaped grinding wheel 60 of the finishing grinding stage 20. Since the structure of the finishing grinding stage 20 is identical as that of the rough grinding stage 18, the description on it will be omitted. In this embodiment, there are two grinding stages; however, there may be only one grinding stage. The thickness measurement by the thickness gauges may be performed by an in-line measurement.

After the cup-shaped grinding wheel 60 has retreated from the wafer 28, the wafer 28 with its reverse already ground finely at the finishing grinding stage 20 is again measured its thickness by a thickness gauge with the identical structure as the one in FIG. 6. The wafer 28 with its thickness already measured is placed at the etching stage by a turn by 90 degree in the direction of the arrow A of the index table 34, and is etched to remove the broken layer formed on the reverse. The thickness measurement by the thickness gauges may be performed by an in-line measurement.

Figures 7, 8:
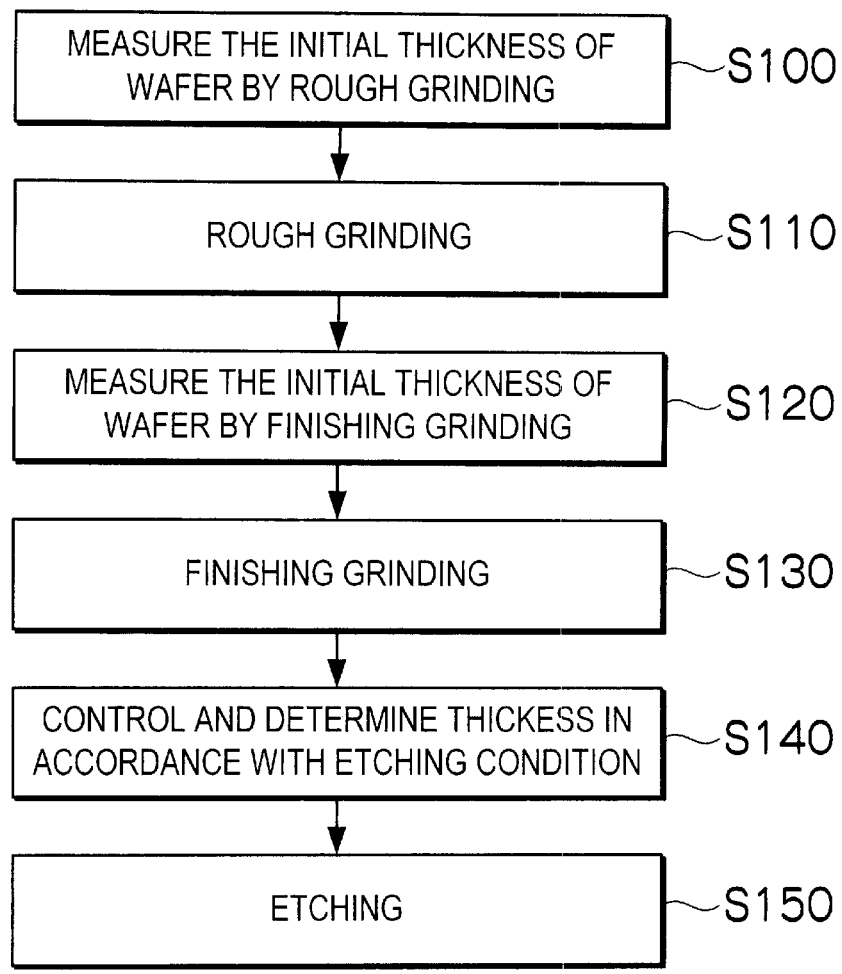
FIG. 7 is a flowchart showing wafer thickness control in the planarization apparatus.
FIG. 8 is a table showing speed, amount, and time for rough grinding, finishing grinding, and etching.

The description is now given to controlling of the thickness of the wafer 28 in the planarization apparatus 10 with reference to FIG. 7. First, the thickness of the wafer 28 at the initial state before the rough grinding is measured (step S100), and the grinding amount by the rough grinding is determined based on the measured thickness, then the wafer 28 is roughly ground at the rough grinding stage 18 (step S110). Then, the thickness of the wafer 28 after the rough grinding is measured (step S120), and the grinding amount by the finishing grinding is determined based on the measured thickness, then the wafer 28 is finely ground at the finishing grinding stage 20 (step S130). Then, the thickness of the wafer 28 after the finishing grinding is measured, and the time length for the etching is determined based on the measured thickness, etching condition, and final thickness (step S140), then the wafer 28 is etched at the etching stage 22 (step S150). These steps are the sequence for controlling thickness of the wafer 28 in the planarization apparatus 10.

The removal amount at the finishing grinding stage 20 is preferably more than the amount required for removing the broken layer formed by the rough grinding, calculated by doubling a standard deviation. It is preferably less than the larger value between the amount required for correcting the unevenness of the thickness during the rough grinding and removing the broken layer, calculated by sextupling the standard deviation, and 150 $\mu$m. This enables the removal of the broken layer formed by the rough grinding without decreasing the availability.

If the amount required for removing the broken layer formed by the rough grinding is calculated by multiplying the standard deviation by less than two, the broken layer cannot always be removed completely. On the other hand, if the amount required for removing the unevenness of the thickness and the broken layer formed during the rough grinding is set at a value in excess of the larger value between a value found by multiplying a standard deviation by six, and 150 $\mu$m; the processing time becomes longer and the rate of operation is lowered.

The removal amount at the etching stage 22 is preferably more than the amount required for removing the broken layer formed by the finishing grinding, calculated by doubling a standard deviation. It is preferably less than the larger value between the amount required for correcting the unevenness of the thickness during the finishing grinding and removing the broken layer, calculated by sextupling the standard deviation, and 20 $\mu$m. This enables the removal of the broken layer formed by the finishing grinding without lowering the rate of operation.

If the amount for removing the broken layer formed by the finishing grinding is calculated by multiplying the standard deviation by less than two, the broken layer cannot always be removed without fail. On the other hand, if the amount required for correcting the unevenness of the thickness during the finishing grinding and removing the broken layer is set at a value that exceeds the larger value found by multiplying a standard deviation by six, and 20 $\mu$m; the processing time becomes longer and the rate of operation is lowered.

FIG. 8 is a table showing an example of the processing. If the wafer with a diameter of 200 mm and an initial thickness of 725 $\mu$m is to be processed to the thickness of 50 $\mu$m; the rough grinding speed, the finishing grinding speed and the etching speed are set at 225 ($\mu$m/min), 65 ($\mu$m/min) and 6 ($\mu$m/min), respectively, and the removal amounts in the finishing grinding, the rough grinding and the etching are set at 510 $\mu$m, 150 $\mu$m and 14.9 $\mu$m, respectively. In this case, the rough grinding time, the finishing grinding time and the etching time are substantially equal (2.27–2.48min), so that the wafer 28 with the thickness of 725 $\mu$m can be processed to the thickness of 50 $\mu$m without lowering the rate of operation. In this case, the standard deviation of the unevenness in the thickness during the finishing grinding is 2.25 $\mu$m, and six times the standard deviation is 13.5 $\mu$m. The mean of the depth of the broken layer during the finishing grinding is 0.7 $\mu$m, the standard deviation of the depth of the broken layer is 0.11 $\mu$m, and six times the standard deviation is 0.66 $\mu$m. The maximum depth of the broken layer is 1.36 $\mu$m. Therefore, the removal amount for eliminating the unevenness of the thickness at the finishing grinding and removing the broken layer can be set at 14.9 $\mu$m.

The unevenness of the thickness and the broken layer cannot always be removed without fail within the processing time that is calculated in the above-mentioned manner.

To solve this problem, in this embodiment, the removal amount 150 $\mu$m in the finishing grinding is compared with the amount required for eliminating the unevenness of the thickness and the broken layer in the rough grinding, calculated by doubling a standard deviation. If the former is larger, the removal amount is set at 150 $\mu$m. If the latter is larger, the removal amount is set at the latter amount. Consequently, the unevenness of the thickness and the broken layer can be eliminated without fail during the finishing grinding.

Moreover, the removal amount in the etching is compared with the removal amount required for eliminating the unevenness of the thickness and the broken layer in the finishing grinding. If the former is larger, the removal amount is set at 20 $\mu$m. If the latter is larger than 20 $\mu$m, the removal amount is set at the latter value. It is therefore possible to eliminate the unevenness of the thickness and the broken layer without fail during the etching.

Figure 9:
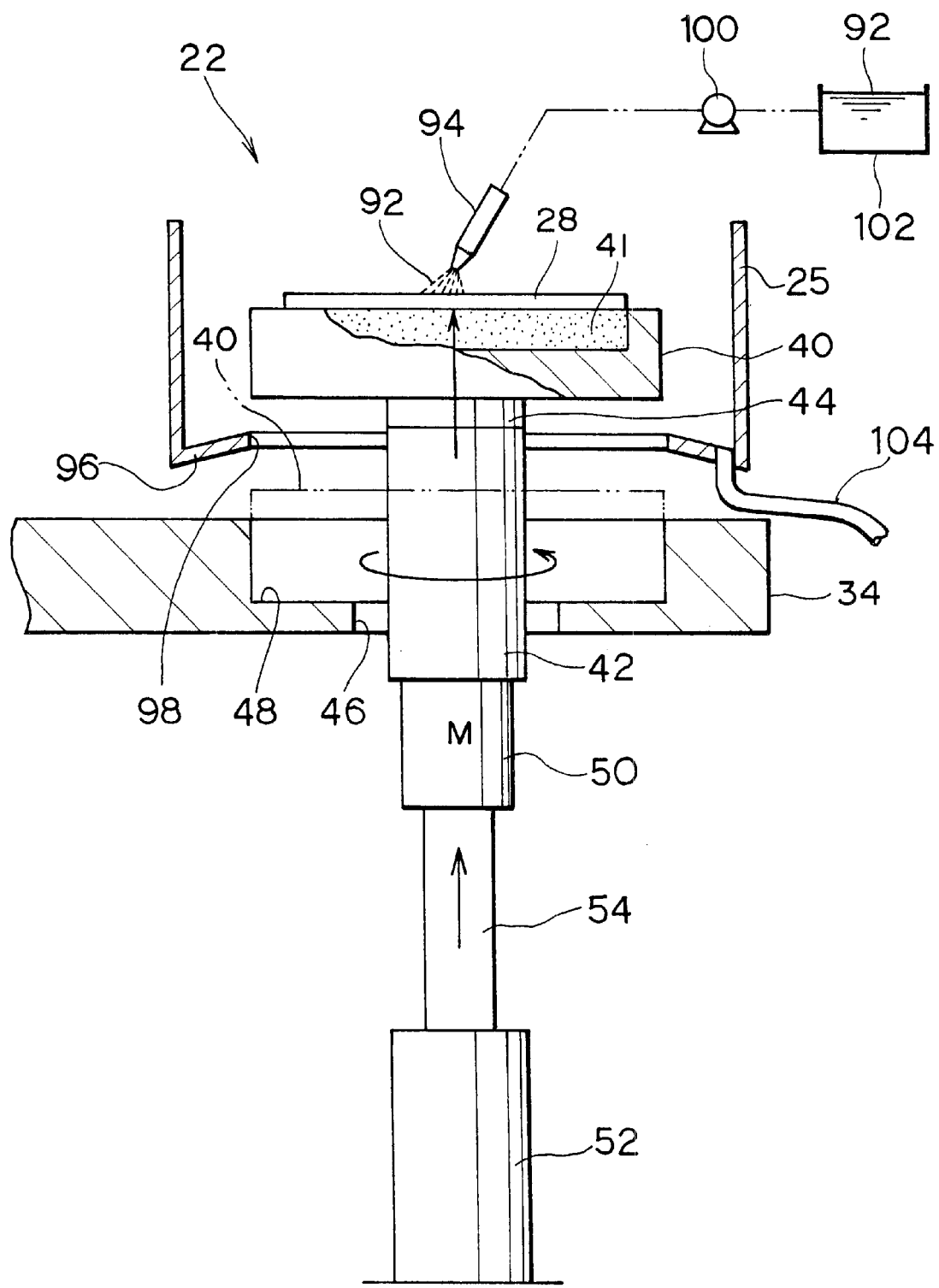
FIG. 9 is a section view showing a structure of an etching stage in the first embodiment.

The etching unit of the etching stage 22 in FIGS. 1 and 2 is of a spinner type, and comprises the etching vessel 25, a nozzle 94 for supplying the etching solution 92, and so forth, as shown in FIG. 9. The etching vessel 25 is provided above the index table 34 with a certain space, and the nozzle 94 is attached at a 25 certain position of the etching vessel 25.

The chuck 40 that is positioned at the etching stage 22 is placed at the step 48 of the opening 46, which is formed at the index table 34. The piston 54 of the cylinder device 52 is connected with the bottom of the motor 50. When contracted, the piston 54 is at the position after having receded from the chuck 40; when extended, the spindle 42 goes through the opening 46 and the connecting member 44 provided at the top of the spindle 52 fits into the recess 56 (shown in FIG. 3) formed at the bottom of the chuck 40. The chuck 40 is then moved up from the index table 34 by the continuous extending motion of the piston 54, and is housed in the etching vessel 25 after going through an insertion opening 98 formed at the bottom 96 of the etching vessel 25.

At the etching stage 22, the wafer 28 in the state of being held on the porous body 41 of the chuck 40 is rotated by the motor 50 at a predetermined rotational speed, and the etching solution 92 is projected onto the center of the top face of the wafer 28 from the nozzle 94. The etching solution 92 is radially dispersed on the top face of the wafer 28, and the top face of the wafer 28 is thereby etched. An etching solution tank 102 is connected with the nozzle 94 via a pump 100; as the pump 100 is activated, the etching solution 92 stored in the etching solution tank 102 is projected from the nozzle 94.

The bottom 96 of the etching vessel 25 is in a form that is slanted downward from the center to the outer periphery so that the etching solution 92 that is splashed from the wafer 28 is not leaked through the insertion opening 98. A drain pipe 104 is connected with the outer periphery of the bottom 96, from which the etching solution is discharged.

Figure 10:
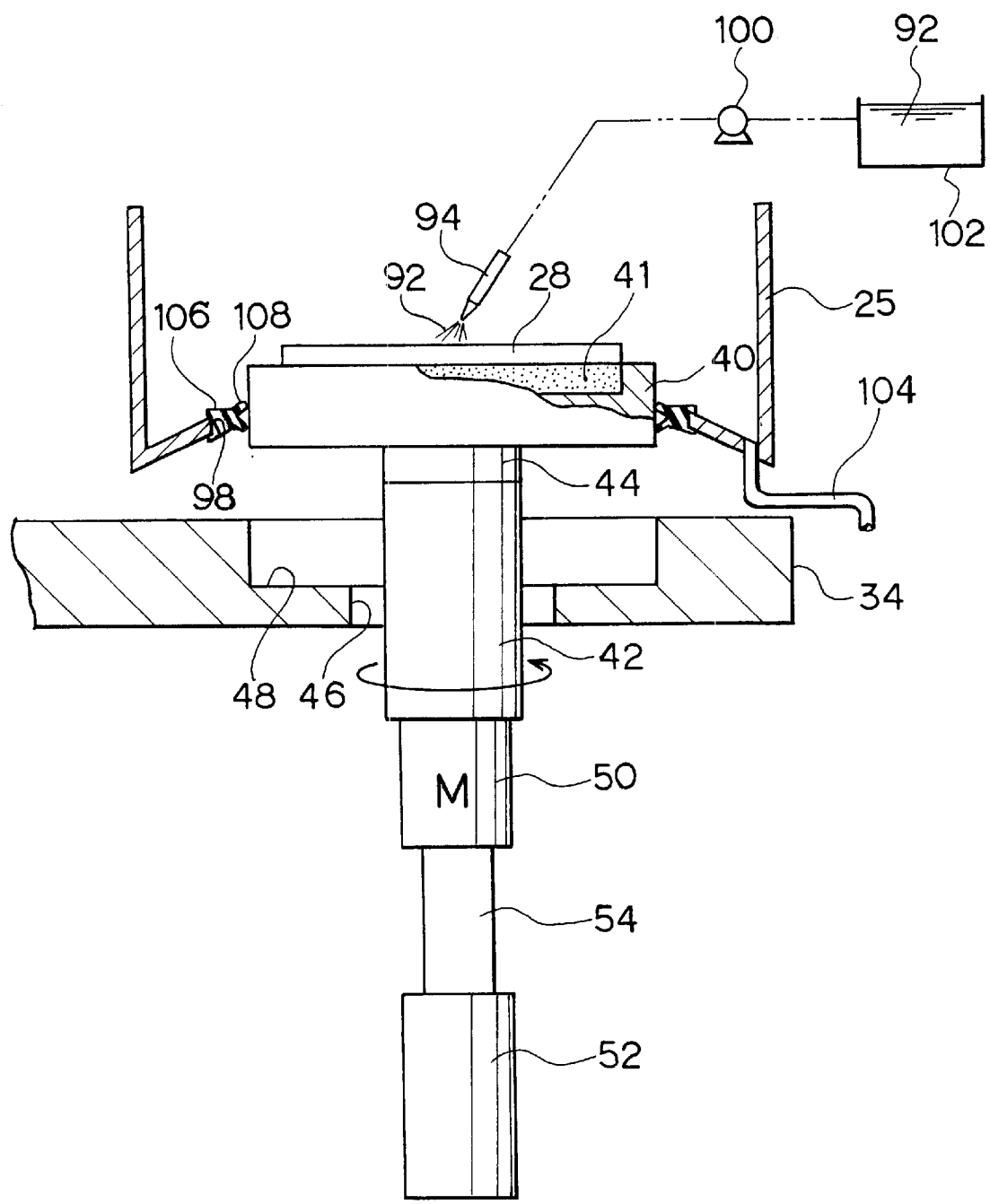
FIG. 10 is a section view showing a structure of the etching stage in the second embodiment.

The etching unit in FIG. 9 rotates the chuck 40 with respect to the etching vessel 25 in a non-contact state; however, the etching unit is not limited to that type. As shown in FIG. 10 for example, the chuck 40 may be rotated with a seal structure, in which a seal member 106 is attached to the periphery of the insertion opening 98 of the etching vessel 25, and a lip 108 of the seal member 106 is in contact with the outer periphery of the chuck 40. The leakage of the etching solution through the insertion opening 98 can thereby be sufficiently prevented. Further, the upper opening of the etching vessel 25 is preferably closed with a ceiling plate (not shown) in view of preventing the splash of the etching solution 92.

When the etching for the wafer 28 is completed, the piston 54 is contracted, whereby the chuck 40 returns to its original position where it is placed on the step 48 of the index table 34 while holding the wafer 28. Subsequently, by a turn by 90 degree in the direction of the arrow A of the index table 34, the chuck 40 is transferred to the position of the chuck 32 in FIG. 2 while the wafer 28 is being placed on the chuck 40. Then, the wafer 28 is held by suction by a hand 112 of a robot 110 so as to be transported to the wafer obverse (protecting sheet) cleaning stage 24.

The wafer obverse (protecting sheet) cleaning stage 24 includes a rotating brush 114 for cleaning the face where the protecting sheet is adhered on the obverse of the wafer 28. The wafer 28 that has been cleaned by the rotating brush 114 is held by suction by the hand 112 of the robot 110 and is transported to a spin cleaning and drying unit 116 so as to be cleaned and dried by spinning. The dried wafer 28 is held again by the hand 112 of the robot 110 and is housed in a predetermined shelf of the cassette 26. These steps are the flow of processing the wafer 28 in the planarization apparatus 10.

As described above, in the planarization apparatus 10 of the present embodiment, the etching stage 22 is installed in the body 12 of the planarization apparatus 10 in which the rough grinding stage 18 and the finishing grinding stage 20 for the wafer 28 are installed. Then, the grinding and etching for the wafer 28 can be performed in the same apparatus, and the wafer 28 already ground does not have to be transported from the planarization apparatus to the etching apparatus. Hence, the wafer 28 can be ground up to the thickness close to the standardized thickness at the rough grinding stage 18 and the finishing grinding stage 20. The throughput is thereby improved.

In the planarization apparatus 10, the wafer 28 is ground and etched while being held by the chuck; thus, the wafer 28 can be precisely processed without breaking the wafer.

At the etching stage 22, the broken layer formed on the reverse of the wafer 28 that is ground at the finishing grinding stage 20 is etched; thus, the wafer 28 with high precision can be obtained.

Moreover, since the four chucks 32, 36, 38 and 40 are provided and the rough grinding, finishing grinding, and etching can be performed at the same time by moving the four chucks in an order from the rough grinding position to the finishing grinding position and further to the etching position, the net working rate is higher than a case to perform on the wafer 28 the rough grinding, finishing grinding, and etching with one chuck.

In the present embodiment, the wafer is exemplified as a workpiece; however the workpiece is not limited to wafers; the planarization apparatus of the present invention is applicable to any workpiece that requires etching after planarization.

As described hereinabove, in the planarization apparatus of the present invention, the etching device is installed in the planarization apparatus in which the grinding device for the workpiece is installed so as to perform grinding and etching in the same apparatus; thus the throughput is improved without breaking the workpiece.

In the present invention, the broken layer formed on a face of the workpiece that is ground by the grinding device is etched by the etching device; thus, the wafer with a high precision can be obtained.

Furthermore, the finishing grinding device finely grinds the workpiece by an amount more than an amount required for removing the broken layer formed by the rough grinding, calculated by doubling a standard deviation, and less than a larger value between a removal amount required for correcting an unevenness of a thickness during the rough grinding and removing the broken layer, calculated by sextupling a standard deviation, and 150 $\mu$m. This enables the removal of the broken layer formed by the rough grinding without lowering the rate of operation. The etching device etches the workpiece by an amount more than a removal amount required for removing the broken layer formed by the finishing grinding, calculated by doubling a standard deviation, and less than a larger value between a removal amount required for correcting an unevenness of a thickness during the finishing grinding and removing the broken layer, calculated by sextupling a standard deviation, and 20 $\mu$m. This enables the removal of the broken layer formed by the finishing grinding without lowering the rate of operation.

It should be understood, however, that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A planarization apparatus comprising:

a holding device which holds a workpiece;

a grinding device comprising a grinding wheel which grinds a face of the workpiece held by the holding device;

an etching device which etches the workpiece; and a moving device which moves the holding device between a grinding position of the grinding device and an etching position of the etching device, wherein the workpiece is ground by the grinding device and etched by the etching device while being held by the holding device.

2. The planarization apparatus as defined in claim 1, wherein the etching device etches a broken layer formed on the face of the workpiece having been ground by the grinding device.

3. The planarization apparatus as defined in claim 1, wherein the etching device etches the face of the workpiece by an amount of thickness variation of the workpiece.

* * * * *